United States Patent
Mebarki et al.

(10) Patent No.: US 10,014,174 B2
(45) Date of Patent: Jul. 3, 2018

(54) CONFORMAL STRIPPABLE CARBON FILM FOR LINE-EDGE-ROUGHNESS REDUCTION FOR ADVANCED PATTERNING

(71) Applicant: Applied Materials, Inc., Santa Clara, CA (US)

(72) Inventors: Bencherki Mebarki, Santa Clara, CA (US); Pramit Manna, Sunnyvale, CA (US); Li Yan Miao, Sunnyvale, CA (US); Deenesh Padhi, Sunnyvale, CA (US); Bok Hoen Kim, San Jose, CA (US); Christopher Dennis Bencher, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/602,862

(22) Filed: May 23, 2017

(65) Prior Publication Data
US 2017/0278709 A1 Sep. 28, 2017

Related U.S. Application Data

(63) Continuation of application No. 15/137,486, filed on Apr. 25, 2016, now Pat. No. 9,659,771.
(Continued)

(51) Int. Cl.
*H01L 21/033* (2006.01)
*H01L 21/02* (2006.01)
(Continued)

(52) U.S. Cl.
CPC ...... *H01L 21/0337* (2013.01); *H01L 21/0273* (2013.01); *H01L 21/02118* (2013.01);
(Continued)

(58) Field of Classification Search
CPC .......... H01L 21/0337; H01L 21/02118; H01L 21/02266; H01L 21/02274; H01L 21/0273; H01L 21/31058; H01L 21/31138
See application file for complete search history.

(56) References Cited

U.S. PATENT DOCUMENTS 4,882,256 A 11/1989 Osawa et al.
6,228,747 B1 * 5/2001 Joyner ................ H01L 21/3081
257/394
(Continued)

FOREIGN PATENT DOCUMENTS

JP 5637212 B2 12/2014
KR 10-2009-0018725 2/2009

OTHER PUBLICATIONS

International Search Report and Written Opinion for International Application No. PCT/US2016/029746 dated Jul. 19, 2016.
(Continued)

*Primary Examiner* — Duy Vu N Deo
(74) *Attorney, Agent, or Firm* — Patterson + Sheridan LLP

(57) ABSTRACT

Embodiments of the disclosure relate to deposition of a conformal organic material over a feature formed in a photoresist or a hardmask, to decrease the critical dimensions and line edge roughness. In various embodiments, an ultra-conformal carbon-based material is deposited over features formed in a high-resolution photoresist. The conformal organic layer formed over the photoresist thus reduces both the critical dimensions and the line edge roughness of the features.

20 Claims, 5 Drawing Sheets

Related U.S. Application Data

(60) Provisional application No. 62/174,248, filed on Jun. 11, 2015.

(51) Int. Cl.
*H01L 21/311* (2006.01)
*H01L 21/3105* (2006.01)
*H01L 21/027* (2006.01)

(52) U.S. Cl.
CPC .. *H01L 21/02266* (2013.01); *H01L 21/02274* (2013.01); *H01L 21/31058* (2013.01); *H01L 21/31138* (2013.01); *H01L 2221/00* (2013.01)

(56) References Cited

U.S. PATENT DOCUMENTS

| | | | |
|---|---|---|---|
| 6,316,169 | B1 | 11/2001 | Vahedi et al. |
| 6,500,756 | B1 | 12/2002 | Bell et al. |
| 6,596,599 | B1 | 7/2003 | Guo |
| 8,435,608 | B1 | 5/2013 | Subramonium et al. |
| 9,721,784 | B2 * | 8/2017 | Behera .............. H01L 21/02115 |
| 2006/0154477 | A1 | 7/2006 | Geng et al. |
| 2007/0049040 | A1 | 3/2007 | Bai et al. |
| 2008/0122125 | A1 | 5/2008 | Zhou |
| 2009/0061638 | A1 | 3/2009 | Yi |
| 2009/0311634 | A1 | 12/2009 | Yue et al. |
| 2010/0075503 | A1 | 3/2010 | Bencher et al. |
| 2010/0093187 | A1 | 4/2010 | Lee et al. |
| 2010/0136784 | A1 | 6/2010 | Mebarki et al. |
| 2010/0136792 | A1 | 6/2010 | Mebarki et al. |
| 2010/0291713 | A1 | 11/2010 | Lee et al. |
| 2011/0021026 | A1 | 1/2011 | Luning et al. |
| 2011/0177669 | A1 | 7/2011 | Lee et al. |
| 2011/0244142 | A1 | 10/2011 | Cheng et al. |
| 2011/0272765 | A1 * | 11/2011 | Seo ........................ H01L 23/485 257/410 |
| 2012/0015521 | A1 | 1/2012 | Yu et al. |
| 2013/0189845 | A1 | 7/2013 | Kim |

OTHER PUBLICATIONS

Office Action for U.S Appl. No. 14/770,412 dated Jun. 16, 2016.
International Search Report and Written Opinion for International Application No. PCT/US2014/016604 dated May 30, 2014.
Office Action for U.S. Appl. No. 14/736,848 dated Nov. 5, 2015.
Final Office Action for U.S. Appl. No. 14/736,848 dated May 5, 2016.
Search Report and Office Action for Taiwan Application No. 102102025 dated Apr. 13, 2016.
International Search Report and Written Opinion dated May 15, 2013 for International Application No. PCT/US2013/021769.
Office Action for U.S Appl. No. 13/354,129 dated Jun. 7, 2013.
Final Office Action for U.S. Appl. No. 13/354,129 dated Dec. 31, 2013.
International Preliminary Report on Patentability for International Application No. PCT/US13/021769 dated Jul. 31, 2014.
Office Action for U.S Appl. No. 14/371,989 dated Dec. 3, 2014.
Final Office Action for U.S. Appl. No. 14/371,989 dated Feb. 25, 2015.
Notice of Allowance for U.S. Appl. No. 15/137,486, dated Jan. 26, 2017.

* cited by examiner

CONFORMAL STRIPPABLE CARBON FILM FOR LINE-EDGE-ROUGHNESS REDUCTION FOR ADVANCED PATTERNING

CROSS-REFERENCE TO RELATED APPLICATIONS

This application is a continuation of U.S. Ser. No. 15/137,486, filed on Apr. 25, 2016, now issued as U.S. Pat. No. 9,659,771, which claims benefit of U.S. provisional patent application Ser. No. 62/174,248, filed Jun. 11, 2015, which is herein incorporated by reference.

BACKGROUND

Field

Embodiments of the present disclosure generally relate to the fabrication of integrated circuits and particularly to methods for changing critical dimensions of features during an etching process.

Description of the Related Art

Reducing the size of integrated circuits (ICs) results in improved performance, increased capacity and/or reduced cost. Each size reduction requires more sophisticated techniques to form the ICs. Photolithography is commonly used to pattern ICs on a substrate. An exemplary feature of an IC is a line of a material which may be a metal, semiconductor or insulator. Line width is the width of the line and the spacing is the distance between adjacent lines. Pitch is defined as the distance between a same point on two adjacent lines. The pitch is equal to the sum of the line width and the spacing. However, due to factors such as optics and light or radiation wavelength, photolithography techniques have a minimum pitch below which a particular photolithographic technique may not reliably form features. Thus, the minimum pitch of a photolithographic technique can limit feature size reduction. Similarly, patterning tools designed to create vias or line interconnects 100 nm wide or more are not commonly able to create smaller vias. Therefore, as devices shrink to these small dimensions, current lithography processes are challenged to create patterns with the chosen critical dimensions (CD).

Variations in the width of an IC feature along one edge is typically called line-edge roughness (LER). LER has increasingly become a concern in advanced technology nodes, such as for feature sizes on the order of 100 nm or less. In one example, when considering LER below 14 nm technology node, uncontrolled LER can lead to leaky transistor failure in Front-End-Of-line (FEOL) applications, or reliability loss at the interconnect level in Back-End-Of-Line (BEOL) applications. Current LER is close to 4-5 nm for both Immersion lithography, and EUV lithography.

One approach to reduce LER is by photoresist curing using implant or e-Beam. However, these approaches decrease throughput and are not cost effective. Further, the photoresist curing methods recited above do not provide Critical Dimension (CD) shrink. CD shrink is required either to extend current Immersion lithography flow, or to help get narrower dimension with EUV.

Given the current state of the art, there is a continuing need for reduced CD and LER reduction for advanced technology node applications.

SUMMARY

Embodiments disclosed herein generally relate to methods and apparatus for decreasing the critical dimensions of a feature formed in a photoresist or a hardmask. In one embodiment, a method of processing a substrate includes forming a feature in a photoresist layer to expose a portion of a hardmask layer deposited below the photoresist layer, depositing a first organic layer directly on the photoresist layer, the first organic layer conformally covering exposed surfaces of the feature and exposed portions of the hardmask layer, selectively removing the first organic layer from a top surface of the photoresist layer and the exposed portions of the hardmask layer, while leaving the first organic layer deposited on sidewalls of the feature substantially intact, forming a second organic layer conformally on the top surface of the photoresist layer, the exposed portion of the hardmask layer and the sidewalls of the feature, selectively removing the second organic layer from the top surface of the photoresist layer and the exposed portion of the hardmask layer, while leaving the second organic layer deposited on the first organic layer on the sidewalls of the feature substantially intact, and forming a pattern into the hardmask layer using the photoresist layer, the first organic layer and the second organic layer as a mask.

In another implementation, the method includes forming a feature in a photoresist layer to expose a portion of a hardmask layer deposited below the photoresist layer, depositing a first organic layer directly on the photoresist layer by exposing the photoresist layer to a plasma formed from a hydrocarbon source, a plasma-initiating gas, and a dilution gas, the first organic layer conformally covering exposed surfaces of the feature and exposed portions of the hardmask layer, selectively removing the first organic layer from a top surface of the photoresist layer and the exposed portions of the hardmask layer, while leaving the first organic layer deposited on sidewalls of the feature substantially intact, forming a second organic layer conformally on the top surface of the photoresist layer, the exposed portion of the hardmask layer and the sidewalls of the feature, selectively removing the second organic layer from the top surface of the photoresist layer and the exposed portion of the hardmask layer, while leaving the second organic layer deposited on the first organic layer on the sidewalls of the feature substantially intact, and forming a pattern into the hardmask layer using the photoresist layer, the first organic layer and the second organic layer as a mask.

In yet another embodiment, the method includes forming a feature in a photoresist layer to expose a portion of a hardmask layer deposited below the photoresist layer, depositing a first organic layer directly on the photoresist layer, wherein the first organic layer is an amorphous carbon layer conformally covering exposed surfaces of the feature and exposed portions of the hardmask layer, selectively removing the first organic layer from a top surface of the photoresist layer and the exposed portions of the hardmask layer, while leaving the first organic layer deposited on sidewalls of the feature substantially intact, forming a second organic layer conformally on the top surface of the photoresist layer, wherein the second organic layer is an amorphous carbon layer, selectively removing the second organic layer from the top surface of the photoresist layer and the exposed portion of the hardmask layer, while leaving the second organic layer deposited on the first organic layer on the sidewalls of the feature substantially intact, and forming a pattern into the hardmask layer using the photoresist layer, the first organic layer and the second organic layer as a mask.

BRIEF DESCRIPTION OF THE DRAWINGS

So that the manner in which the above recited features can be understood in detail, a more particular description of the methods and devices, briefly summarized above, may be had by reference to embodiments, some of which are illustrated in the appended drawings. It is to be noted, however, that the appended drawings illustrate only typical embodiments and are therefore not to be considered limiting of its scope, for the methods and devices may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein relate to deposition of an ultra-conformal carbon-based material for decreasing the critical dimensions and line edge roughness of a feature formed in a photoresist or a hardmask. In various embodiments, an ultra-conformal carbon-based material is deposited over features formed in a high-resolution photoresist. In one example, a low temperature conformal strippable organic layer (referred to herein as the "conformal organic layer") may be deposited directly on photoresist. The term "low temperature" described in this disclosure may refer to a temperature range of about 150° C. to about 600° C., for example about 300° C. to about 500° C., such as about 450° C. The photoresist will have features formed therein prior to the deposition. The conformal organic layer formed over the photoresist thus reduces both the CD of the features and the LER of the features, by smoothing edge non-uniformities in the walls of the feature. The conformal organic layer has the advantage of reacting to the same oxygen chemistry that is used to remove the photoresist layer. Thus, the conformal organic layer can be stripped away in dry oxygen based plasma at the same time as photoresist strip. This conformal organic layer/photoresist combination strip saves one process step, thus reducing costs. Further, being able to be stripped in dry plasma overcomes the wet strip issues, such as lines collapse (e.g., by capillary effect), and overcomes wet strip induced defects.

Embodiments described herein may be performed using any suitable processing chamber such as a plasma enhanced chemical vapor deposition (PECVD) chamber. The processing chamber may be incorporated into a substrate processing system. Examples of suitable systems include the CENTURA® systems which may use a DxZ™ processing chamber, PRECISION 5000® systems, PRODUCER™ systems, PRODUCER GT™ and the PRODUCER SE™ processing chambers which are commercially available from Applied Materials, Inc., located in Santa Clara, Calif. It is contemplated that other deposition processing system, including those available from other manufacturers, may be adapted to practice the embodiments described herein.

Figure 1:
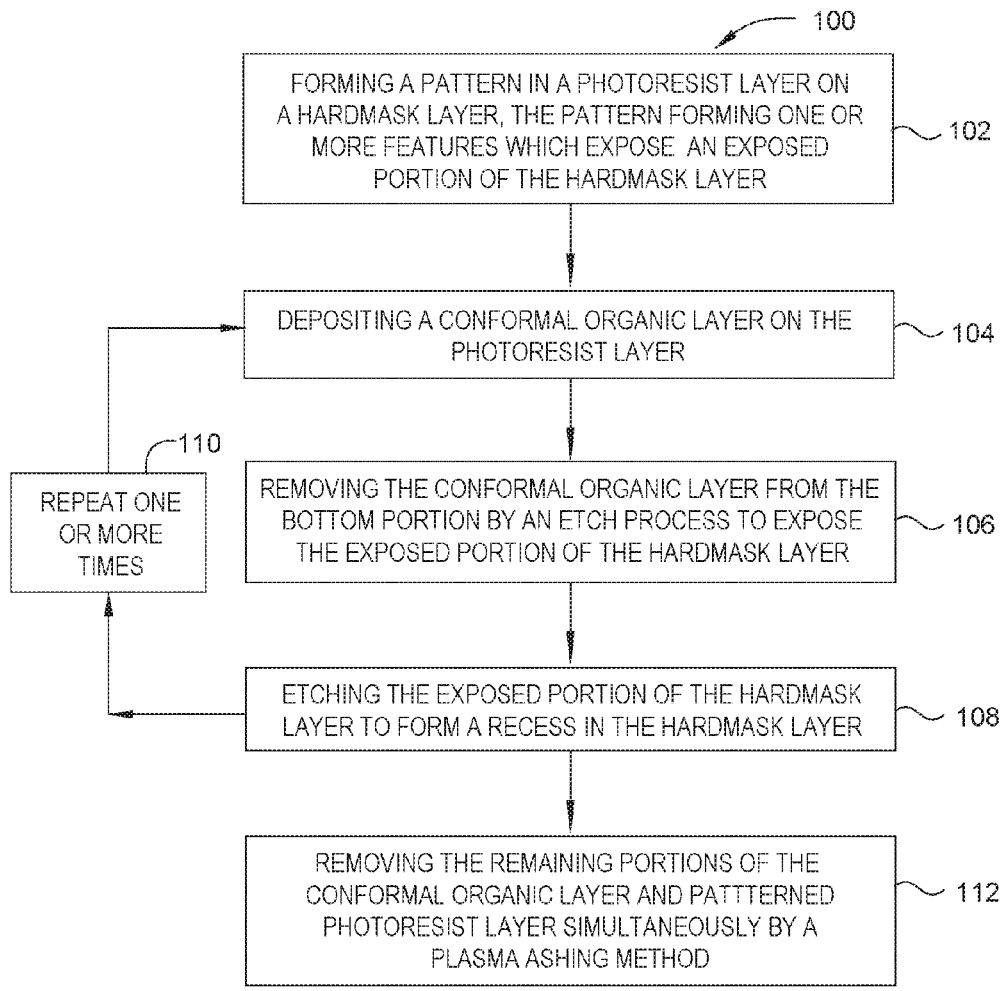
FIG. 1 is a flowchart depicting steps associated with an exemplary patterning method according to one embodiment of the disclosure.

FIG. 1 is a flow diagram illustrating a method 100 of processing a substrate, according to one embodiment. FIGS. 2A-2H depict cross-sectional views representing the patterning process as described in FIG. 1. The method 100 can include forming a pattern in a photoresist layer on a hardmask layer, the pattern forming one or more features which expose an exposed portion of the hardmask layer, at 102; depositing a conformal organic layer on the photoresist layer, at 104; removing the conformal organic layer from the bottom portion by an etch process to expose the exposed portion of the hardmask layer, at 106; etching the exposed portion of the hardmask layer to form a recess in the hardmask layer, at 108; and removing the remaining portions of the conformal organic layer and patterned photoresist layer simultaneously by a plasma ashing method, at 110.

Figure 2A:
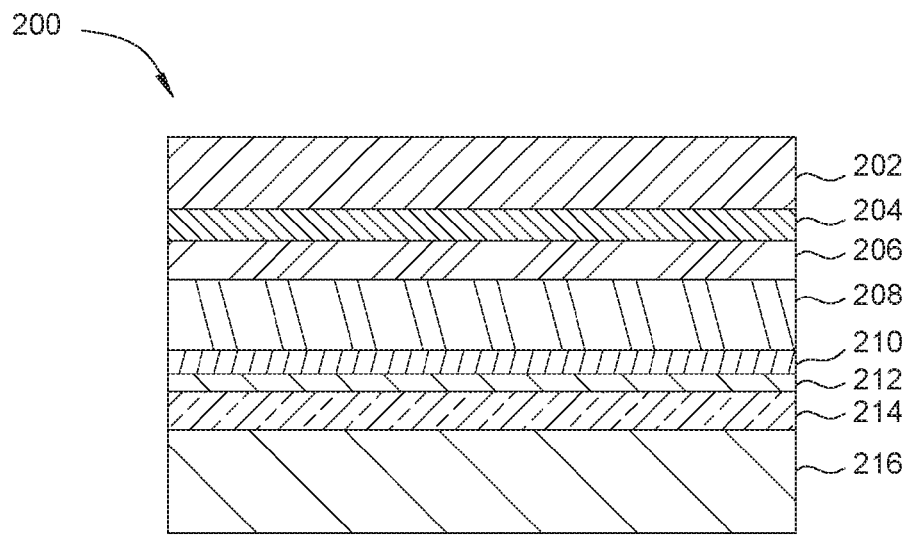
FIGS. 2A-2H illustrate cross-sectional views representing a patterning method as set forth by FIG. 1, according to an embodiment of the disclosure.
Figure 2B:
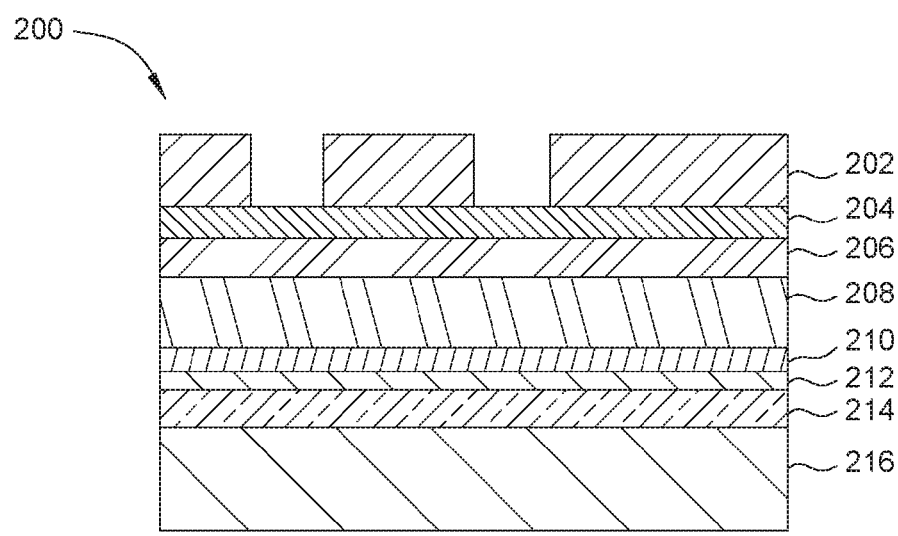

FIG. 2A illustrates a number of possible layers comprising the multilayer substrate 200. Shown here, the multilayer substrate 200 includes a substrate 216, an active layer 214, an oxide layer 212, a metal layer 210, a carbon layer 208, an anti-reflective layer 206, a hardmask layer 204 and a photoresist layer 202.

In some embodiments, the multilayer substrate 200 may also include a plurality of alternating oxide and nitride materials (i.e., oxide-nitride-oxide (ONO), one or more oxide or nitride materials, polysilicon or amorphous silicon materials, oxides alternating with amorphous silicon, oxides alternating with polysilicon, undoped silicon alternating with doped silicon, undoped polysilicon alternating with doped polysilicon, or undoped amorphous silicon alternating with doped amorphous silicon deposited on a surface of the substrate. The multilayer substrate 200 may be a layer stack comprising one or more of the following: crystalline silicon, silicon oxide, silicon oxynitride, silicon nitride, strained silicon, silicon germanium, tungsten, titanium nitride, doped or undoped polysilicon, doped or undoped silicon wafers and patterned or non-patterned wafers, silicon on insulator (SOI), carbon doped silicon oxides, silicon nitrides, doped silicon, germanium, gallium arsenide, glass, sapphire, low k dielectrics, and combinations thereof. Multilayer substrate 200 may also comprise of layers containing carbonaceous materials such as photoresists, anti-reflective coatings, and other spin-on coatings.

The method 100 begins at 102 by forming a pattern in a photoresist layer on a hardmask layer, the pattern forming one or more features which expose an exposed portion of the hardmask layer. The multilayer substrate 200 is provided to a plasma processing chamber, wherein the multilayer substrate 200 resides on a temperature controlled substrate holder or chuck. The multilayer substrate 200 is then equilibrated to a temperature less than the decomposition temperature of the photoresist layer 202. The photoresist layer 202 is disposed over the hardmask layer 204 and is patterned using a lithography type process, at 102.

The photoresist layer 202 may be a polymer material sensitive to a certain wavelength of electromagnetic radiation, and may be applied through a spin coating process or a CVD process. In some embodiments, the photoresist layer 202 is a carbon-based polymer sensitive to ultraviolet light, such as a phenolic resin, an epoxy resin, or the like. The photoresist layer 202 may be a positive or a negative photoresist. Positive photoresists may be selected from the group consisting of a 248 nm photoresist, a 193 nm photoresist, a 157 nm photoresist, and a phenolic resin matrix with a diazonapthoquinone sensitizer. Negative photoresists may be selected from the group consisting of poly-cis-isoprene and poly-vinylcinnamate. Notably, photoresist materials will decompose at temperatures much lower than the other non-carbonaceous layers present in the multilayer substrate 200. Photoresist used in embodiments described herein have decomposition temperatures which range from 100° C. to 150° C. Photoresist decomposition results in compromised patterning performance and poor process yield.

Figure 2C:
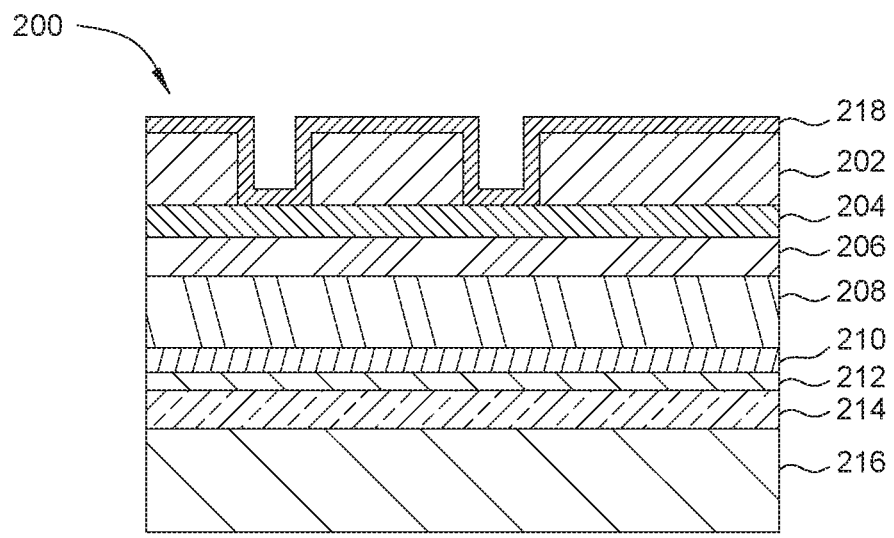

As illustrated by FIG. 2C, conformal organic layer 218 is deposited over the field region, sidewalls, and the bottom portion formed by the patterned photoresist layer 202 and the upper surface of the reduced dimension pattern transfer hardmask layer 204, at 104. The conformal organic layer 218 may be disposed over the patterned photoresist layer 202 by a PECVD process from gaseous precursors that are provided to a reactor containing the multilayer substrate 200.

Embodiments of the present disclosure may be performed using any suitable processing chamber such as plasma enhanced chemical vapor deposition chamber. The processing chamber may be incorporated into a substrate processing system with a temperature controlled chuck to hold the multilayer substrate 200. Examples of suitable systems include the CENTURA® systems which may use a DxZ™ processing chamber, PRECISION 5000® systems, PRODUCER™ systems, PRODUCER GT™ and the PRODUCER SE™ processing chambers which are commercially available from Applied Materials, Inc., Santa Clara, Calif. It is contemplated that other processing systems, including those available from other manufacturers, may be adapted to practice the embodiments described herein.

The conformal organic layer 218, when deposited using process conditions discussed below, will achieve step coverage of at least about 80% or more, for example about 100% or more, such as 120%. The thickness of the conformal organic layer 218 may be between about 5 Å and about 200 Å. In one embodiment, the conformal organic layer 218 is an amorphous carbon (a-C) layer. The amorphous carbon may be undoped or doped with nitrogen. In one example, the conformal organic layer 218 is a nitrogen-doped amorphous carbon layer. The nitrogen-doped amorphous carbon layer may be deposited by any suitable deposition techniques such as plasma enhanced chemical vapor deposition (PECVD) process. In one embodiment, the nitrogen-doped amorphous carbon layer may be deposited by flowing, among others, a hydrocarbon source, a nitrogen-containing gas such as $N_2$ or $NH_3$, a plasma-initiating gas, and a dilution gas into a PECVD chamber. In another embodiment, the nitrogen-doped amorphous carbon layer may be deposited by flowing, among others, a hydrocarbon source, a nitrogen-containing hydrocarbon source, a plasma-initiating gas, and a dilution gas into a PECVD chamber. In yet another embodiment, a nitrogen-containing hydrocarbon source, a plasma-initiating gas, and a dilution gas are flowed into the PECVD chamber to form the nitrogen-doped amorphous carbon protective layer on the patterned features and the exposed surfaces of the substrate 200.

The hydrocarbon source may be a mixture of one or more hydrocarbon compounds. The hydrocarbon source may include a gas-phase hydrocarbon compound and/or a gas mixture including vapors of a liquid-phase hydrocarbon compound and a carrier gas, as will be further discussed below. The plasma-initiating gas may be helium since it is easily ionized; however, other gases, such as argon, may also be used. The dilution gas may be an easily ionized, relatively massive, and chemically inert gas such as argon, krypton, xenon. In some cases, additional hydrogen dilution can be introduced to further increase the film density, as will be discussed later.

The hydrocarbon compounds may be partially or completely doped derivatives of hydrocarbon compounds, including fluorine-containing, oxygen-containing, hydroxyl group-containing, and boron-containing derivatives of hydrocarbon compounds. The hydrocarbon compounds may contain nitrogen or be deposited with a nitrogen-containing gas, such as ammonia, or the hydrocarbon compounds may have substituents such as fluorine and oxygen. Generally, hydrocarbon compounds or derivatives thereof that may be included in the hydrocarbon source may be described by the formula $C_xH_y$, where x has a range of between 1 and 20, and y has a range of between 1 and 20. In another embodiment, the hydrocarbon compounds or derivatives thereof that may be included in the hydrocarbon source may be described by the formula $C_xH_yF_z$, where x has a range of between 1 and 24, y has a range of between 1 and 50, and z has a range of 0 to 50, and the ratio of x to y+c is 1:2 or greater. In yet another embodiment, the hydrocarbon source may be described by the formula $C_aH_bO_cF_dN_e$ for oxygen and/or nitrogen substituted compounds, where a has a range of between 1 and 24, b has a range of between 1 and 50, c has a range of 1 to 10, d has a range of 0 to 50, e has a range of 0 to 10, and the ratio of a to b+c+d+e is 1:2 or greater.

Suitable hydrocarbon compounds include one or more of the following compounds, for example, alkanes such as methane ($CH_4$), ethane ($C_2H_6$), propane ($C_3H_8$), butane ($C_4H_{10}$) and its isomer isobutane, pentane ($C_5H_{12}$) and its isomers isopentane and neopentane, hexane ($C_6H_{14}$) and its isomers 2-methylpentane, 3-methylpentane, 2,3-dimethylbutane, and 2,2-dimethyl butane, and so on. Additional suitable hydrocarbons may include alkenes such as ethylene, propylene, butylene and its isomers, pentene and its isomers, and the like, dienes such as butadiene, isoprene, pentadiene, hexadiene and the like, and halogenated alkenes include monofluoroethylene, difluoroethylenes, trifluoroethylene, tetrafluoroethylene, monochloroethylene, dichloroethylenes, trichloroethylene, tetrachloroethylene, and the like. Also, alkynes such as acetylene ($C_2H_2$), propyne ($C_3H_4$), butyne ($C_4H_6$), vinylacetylene and derivatives thereof can be used as carbon precursors. Additionally cyclic hydrocarbons, such as benzene, styrene, toluene, xylene, ethylbenzene, acetophenone, methyl benzoate, phenyl acetate, phenylacetylene ($C_8H_6$), phenol, cresol, furan, alpha-terpinene, cymene, 1,1,3,3,-tetramethylbutylbenzene, t-butylether, t-butylethylene, methyl-methacrylate, and t-butylfurfurylether, compounds having the formula $C_3H_2$ and $C_5H_4$, halogenated aromatic compounds including monofluorobenzene, difluorobenzenes, tetrafluorobenzenes, hexafluorobenzene and the like can be used. Halogenated hydrocarbons such as carbon tetrachloride ($CCl_4$), diiodomethane ($CH_2I_2$), chlorofluorocarbon (CFC), bromotrichloromethane ($BrCCl_3$), 1,1-dichloroethylene, bromobenzene, or derivatives thereof may also be used.

Examples of suitable derivatives of hydrocarbon compounds may include, but not limited to fluorinated alkanes, halogenated alkanes, and halogenated aromatic compounds. Fluorinated alkanes may include, but not limited to monofluoromethane, difluoromethane, trifluoromethane, tetrafluoromethane, monofluoroethane, tetrafluoroethanes, pentafluoroethane, hexafluoroethane, monofluoropropanes, trifluoropropanes, pentafluoropropanes, perfluoropropane, monofluorobutanes, trifluorobutanes, tetrafluorobutanes, octafluorobutanes, difluorobutanes, monofluoropentanes, pentafluoropentanes, tetrafluorohexanes, tetrafluoroheptanes, hexafluoroheptanes, difluorooctanes, pentafluorooctanes, difluorotetrafluorooctanes, monofluorononanes, hexafluorononanes, difluorodecanes, pentafluorodecanes, and the like. Halogenated alkenes may include, but not limited to monofluoroethylene, difluoroethylenes, trifluoroethylene, tetrafluoroethylene, monochloroethylene, dichloroethylenes, trichloroethylene, tetrachloroethylene, and the like. Halogenated aromatic compounds may include, but not limited to monofluorobenzene, difluorobenzenes, tetrafluorobenzenes, hexafluorobenzene and the like.

Nitrogen-containing hydrocarbon compounds or derivatives thereof that may be included in the nitrogen-containing hydrocarbon source can be described by the formula CxHyNz, where x has a range of between 1 and 12, y has a range of between 2 and 20, and z has a range of between 1 and 10. Suitable nitrogen containing hydrocarbon compounds may include one or more of the following compounds methylamine, dimethylamine, trimethylamine (TMA), triethylamine, quinoline, imidazole, vinyl imidazole, acetonitrile, acrilonitrile, aniline, pyrrole, pyridine, piperidine, and benzonitrile.

In certain embodiments, oxygen-containing hydrocarbons compounds such as benzaldehyde, acetophenone, anisole, diethyl ether, acetone, metanol, ethanol, isopropanol, ethanolamine, cresol, morpholine, or divinyl ether may also be used in the deposition of amorphous carbon film.

The plasma-initiating gas may be introduced into the PECVD chamber at before and/or same time as the hydrocarbon compound and a plasma is initiated to begin deposition. The plasma-initiating gas may be a high ionization potential gas including, and not limited to, helium gas, hydrogen gas, nitrogen gas, argon gas and combinations thereof. The plasma-initiating gas may also be a chemically inert gas, such as helium gas, nitrogen gas, or argon gas. Suitable ionization potentials for gases are from about 5 eV (electron potential) to 25 eV. The plasma-initiating gas may be introduced into the PECVD chamber prior to the nitrogen containing hydrocarbon source and/or the hydrocarbon source, which allows a stable plasma to be formed and reduces the chances of arcing.

An inert gas is typically used as a dilution gas or a carrier gas to flow with the hydrocarbon source, the plasma-initiating gas, the nitrogen containing hydrocarbon source, or combinations thereof. Suitable dilution gases may include argon (Ar), helium (He), hydrogen ($H_2$), nitrogen ($N_2$), ammonia ($NH_3$), noble gas such as krypton, xenon, or any combinations thereof. In one example, argon is used as the dilution gas for reasons of economy. Ar, He, and $N_2$ may be used to control the density and deposition rate of the amorphous carbon layer. In some cases, the addition of $H_2$ and/or $NH_3$ can be used to control the hydrogen ratio of the amorphous carbon layer. In cases where alkynes such as acetylene ($C_2H_2$) or alkenes such as propylene is used as hydrocarbon source, the carrier gas may not be used during the deposition.

Conformality of amorphous carbon can be enhanced by choice of precursors and deposition conditions. In general, precursors with lower H:C ratio (<1:1 ratio) yield higher conformality. Exemplary process conditions for deposition of a conformal amorphous carbon film are described below.

A hydrocarbon source, a nitrogen-containing gas and a dilution gas may be introduced into a PECVD chamber to deposit a nitrogen-doped amorphous carbon. The hydrocarbon source may be any suitable hydrocarbon compound as discussed above. If a liquid hydrocarbon source is used, the precursor flow may be between about 50 mg/min to about 1000 mg/min. If a gaseous hydrocarbon source is used, the precursor flow may be between about 100 sccm to about 5000 sccm, for example about 200 sccm to about 600 sccm. If a carrier gas is used, the carrier flow may be between about 500 sccm and about 10000 sccm. The plasma-initiating gas may be any suitable plasma-initiating gas as discussed above, and flowed at a flow rate from about 0 sccm to about 50,000 sccm, for example, between about 400 sccm to about 8,000 sccm. The dilution gas may be any dilution gas as described above and supplied at a flow rate from about 0 sccm to about 5,000 sccm, for example about 500 sccm to about 1,000 sccm. The flow rate described herein is intended for a 300 mm substrate, which may vary depending upon the size of the substrate.

In various embodiments, the nitrogen-containing gas may be introduced at a nitrogen-containing gas to hydrocarbon source ratio of about 1:100 to about 20:1, for example about 1:40 to about 10:1. The dilution gas may be introduced at a dilution gas to hydrocarbon source ratio of about 2:1 to about 40:1, for example about 20:1 to about 30:1. In one embodiment, a volumetric flow rate of hydrocarbon source: nitrogen-containing gas:plasma-initiating gas:dilution gas is in a ratio of, for example about 1:1:0.5:20, for example about 1:0.5:0.5:20, for example about 1:0.2:0.5:20, for example about 1:0.2:0.5:30, for example about 1:0.2:0.5:40.

If a nitrogen-containing hydrocarbon source (as described above) is used, the nitrogen-containing hydrocarbon gas may be flowed at a flow rate from about 10 sccm to about 2,000 sccm, for example, from about 500 sccm to about 1,500 sccm. In case the nitrogen-containing hydrocarbon source is a liquid precursor, the nitrogen-containing hydrocarbon source flow can be between 15 mg/min and 2,000 mg/min, for example between 100 mg/min and 1,000 mg/min. In one embodiment, a volumetric flow rate of nitrogen-containing hydrocarbon source: the plasma-initiating gas:dilution gas is in a ratio of, for example about 1:0.5:20, for example about 1:0.2:20, for example about 1:0.8:20, for example about 1:1:20, for example about 1:0.5:30, for example about 1:0.5:40.

During the deposition, the substrate temperature may be maintained between about 0° C. to about 250° C., for example between about 25° C. and about 150° C., such as between 25° C. and 75° C., in order to minimize damage to previously formed features or layers. The process chamber may be maintained at a chamber pressure about 100 mTorr to about 100 Torr, for example from about 2 Torr to about 15 Torr, for example about 8 Torr or greater, such as about 20 Torr. Plasma may be generated by applying RF power at a power density to substrate surface area of from about 0.001 $W/cm^2$ to about 5 $W/cm^2$, such as from about 0.01 $W/cm^2$ to about 1 $W/cm^2$, for example about 0.04 $W/cm^2$ to about 0.07 $W/cm^2$. The power application may be from about 1 Watt to about 2,000 watts, such as from about 10 W to about 100 W, for a 300 mm substrate. RF power can be either single frequency or dual frequency. A dual frequency RF power application is believed to provide independent control of flux and ion energy since the energy of the ions hitting the film surface influences the film density. The applied RF power and use of one or more frequencies may be varied based upon the substrate size and the equipment used. If a single frequency power is used, the frequency power may be between about 10 KHz and about 30 MHz, for example about 13.56 MHz or greater, such as 27 MHz or 60 MHz. If a dual-frequency RF power is used to generate the plasma, a mixed RF power may be used. The mixed RF power may provide a high frequency power in a range from about 10 MHz to about 60 MHz, for example, about 13.56 MHz, 27 MHz or 60 MHz, as well as a low frequency power in a range of from about 10 KHz to about 1 MHz, for example, about 350 KHz. Electrode spacing, i.e., the distance between a substrate and a showerhead, may be from about 200 mils to about 1000 mils, for example, from about 280 mils to about 300 mils spacing.

The process range as discussed herein provides a deposition rate for a nitrogen doped amorphous carbon layer in the range of about 10 Å/min to about 30,000 Å/min. One skilled in the art, upon reading the disclosure herein, can calculate appropriate process parameters in order to produce a nitrogen doped amorphous carbon film of different deposition rates. The as-deposited nitrogen-doped amorphous carbon layer has an adjustable carbon:nitrogen ratio that ranges from about 0.1% nitrogen to about 10% nitrogen, such as about 2% to about 6%. An example of nitrogen doped amorphous carbon materials deposited by the processes described herein is provided as follows.

As discussed above, at suitable conditions, the energetic plasma, comprising some combination of carbon, nitrogen and hydrogen atoms, reacts with and binds to the surface of patterned photoresist layer 202 to form a conformal organic layer 218. The conformal organic layer 218 grows uniformly over the surface of the photoresist layer 202, and is physically and chemically adhered to the soft carbon surface of photoresist layer 202. Advantageously, it is believed that the low temperature of deposition and low thermal energy of the photoresist surface lessens desorption of the energetic impinging carbon, nitrogen and hydrogen atoms, thus leading to greater sticking and binding of the atoms to the soft carbon photoresist surface. Not to be restricted by theory, the chemical bonding of the conformal carbon film to surface of the carbonaceous photoresist may be realized by carbon-carbon bonding, and carbon-nitrogen bonding. The plasma processes performed herein may create unsatisfied chemical valence and dangling bonds in atoms at the substrate surface, such as a carbon containing photoresist. At the surface, the carbon dangling bonds combine with energetic carbon radicals to form new chemical bonds.

The low temperature methods typically yield higher growth rates of conformal organic layer 218 and lower intrinsic carbon layer stresses. By comparison, higher temperature deposits of carbon feature higher stresses due to increased cross-linking, shrinkage, and differences in density, which may lead to delamination of the carbon layer 218 and distortion of the photoresist layer 202. Further unexpected advantages in some embodiments are realized by judicious choice of hydrocarbon and nitrogen precursors. For example, propylene and ammonia may produce carbon layers with enhanced adhesion to the photoresist, step coverage and other desirable carbon layer properties. In one example, propylene gas and ammonia gas are introduced into a processing chamber at a volumetric hydrocarbon source and nitrogen source volumetric ratio of between about 50:1 and about 5:1, and wherein the plasma is generated in the processing chamber is delivered at an RF power density between about 0.01 W/cm$^2$ and about 10 W/cm$^2$.

Figure 2D:
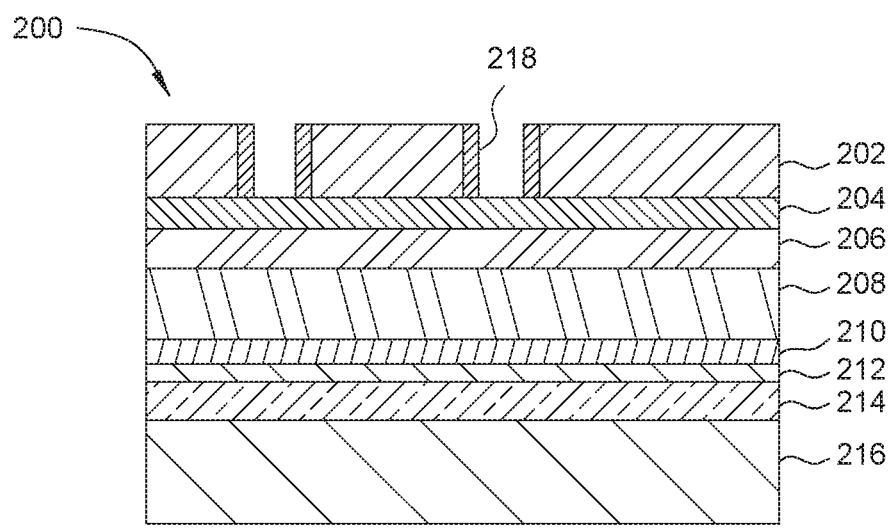

Next, the conformal organic layer 218 is removed using an anisotropic etch process, at 106 and as illustrated in FIG. 2D. Here the layer 218 is removed from the top field region and the bottom of the feature using a plasma etching process. In some embodiments, the selective etching process may be an anisotropic etching process designed to etch material from horizontal surfaces of the substrate only. Such processes may feature a plasma etchant with an electrical bias applied to the substrate to encourage ions in the plasma to accelerate toward the substrate surface, and thus remove the conformal organic layer 218 from the bottom as shown in FIG. 2D. At the same time, such a process may also result in substantial removal of the conformal organic layer 218 from the field region of the photoresist layer 202, also illustrated in FIG. 2D. Reactive ion etching using fluorine and oxygen ions is one example of a selective etching process useful for practicing embodiments of the disclosure. Other suitable etching methods, such as etching by non-reactive ions, may also be used.

The pattern transfer hardmask layer 204 may be a hardmask layer derived from a physical vapor deposition process (PVD), and may be comprised of silicon oxide or silicon rich oxide, or PVD SiN or silicon rich SiN, or SiC or silicon rich SiC, or a combination of the preceding including a variation which includes controlled doping of hydrogen into the compounds, heretofore referred to as the hardmask layer or $SiO_wN_x:H_y$, where w, x, y, each can vary in concentration from 0% to 100%. In one embodiment, w has a range of between 1 and 50, x has a range of between 0 and 50, y has a range of 0 to 50.

The pattern transfer hardmask layer 204 will serve as an etch mask for subsequent etch sequences, and may be a dielectric layer, anti-reflective layer, or barrier layer, and may possess more than one such property.

The hardmask layer 204 is produced as a hardmask with optical properties that are sufficiently matched to a photoresist layer 202. Optical properties such as index of refraction (n) and extinction coefficient (k) of hardmask layer 204 are matched to the photoresist layer 202, so that the interface of the photoresist layer 202 and hardmask layer 204 does not produce reflections that compromise the lithographic patterning process. In some embodiments, matching the optical properties of the hardmask and the photoresist allows for multiple sequences of litho, etch, photoresist strip and reapplication of photoresist to be performed directly on the hardmask layer 204. Moreover, since the material from which the hardmask layer 204 is formed is unaffected by the subsequent plasma assisted ashing process that is used to remove the photoresist layer 202 and conformal organic layer 218 layers, and thus allow the subsequent litho, etch, photoresist strip and reapplication of photoresist process cycles to be performed as many times as required to from a desirable pattern in the hardmask layer 204. In one embodiment the photoresist layer 202 and the hardmask layer 204 has a refractive index (n) equal to between 1.6 and 1.7 and an extinction coefficient (k) equal to 0.00 and 0.12 at a wavelength of 193 nm, such as 0.05. As a result, the exposure electromagnetic energy will not reflect or refract at the physical interface of the hardmask layer 204 and the overlying photoresist layer 202.

One example of a PVD process chamber (e.g., a sputter process chamber) that may be adapted for and suitable for sputter depositing the Hardmask layer 204, is an Impulse™ Pulsed DC PVD Dielectric Chamber, available from Applied Materials, Inc., located in Santa Clara, Calif. It is contemplated that other sputter process chambers, including those from other manufactures, may be adapted to practice the present disclosure.

The deposition of a conformal organic layer 218, the removal of the conformal organic layer 218 and the etching of the exposed portion described in 104, 106 and/or 108 may be repeated one or more times, at 110. Of note, 104 may be repeated alone, 104 and 106 may be repeated in sequence; 104, 106 and 108 may be repeated in sequence; or combinations thereof. In one example, a total of four (4) cycles are completed. The first cycle consisting of 104 and 106; the second cycle consisting of 104, the third cycle consisting of 104, 106 and 108 and the fourth cycle consisting of 104 and 106. Further varieties of combinations are envisioned.

Figure 2E:
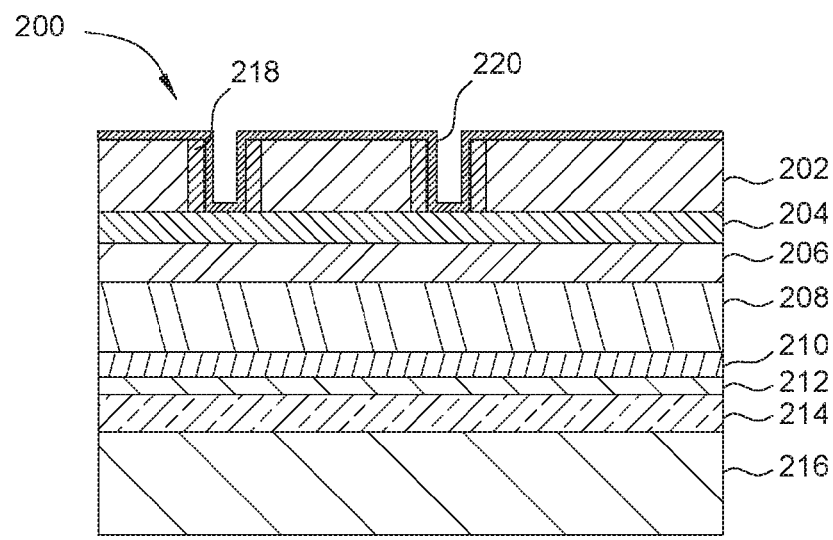

As illustrated by FIG. 2E, an optional second conformal organic layer 220 is deposited over or on the field region, sidewalls, and the bottom portion formed by the patterned photoresist layer 202, the conformal organic layer 218 and the upper surface of the reduced dimension pattern transfer hardmask layer 204. The second conformal organic layer 220 may be disposed over or on the conformal organic layer 218 and the patterned photoresist layer 202 by a PECVD process from gaseous precursors that are provided to a reactor containing the multilayer substrate 200. Suitable process chambers, gases used in the deposition process and process parameters may be substantially the same as described above with reference to FIG. 2C. It is contemplated that other processing systems, including those available from other manufacturers, may be adapted to practice the embodiments described herein.

The second conformal organic layer 220, when deposited using process conditions discussed below, will achieve step coverage of at least about 80% or more, for example about 100% or more, such as 120%. The thickness of the second conformal organic layer 220 may be between about 5 Å and about 200 Å. In one embodiment, the second conformal organic layer 220 has the same composition as the conformal organic layer 218. In one example, the second conformal organic layer 220 is a nitrogen-doped carbon layer. The second conformal organic layer 220 is deposited using a deposition gas, which includes at least a hydrocarbon source. The hydrocarbon source used for the second conformal organic layer 220 may be selected from possible sources described with reference to FIG. 2C.

The hydrocarbon source may be a mixture of one or more hydrocarbon compounds. The hydrocarbon source may include a gas-phase hydrocarbon compound and/or a gas mixture including vapors of a liquid-phase hydrocarbon compound and a carrier gas, as described with reference to FIG. 2C. The deposition gas can be initiated using a plasma-initiating gas. The plasma-initiating gas may be helium since it is easily ionized; however, other gases, such as argon, may also be used. The dilution gas may be an easily ionized, relatively massive, and chemically inert gas such as argon, krypton, xenon. In some cases, additional hydrogen dilution can be introduced to further increase the film density, as will be discussed later.

The plasma-initiating gas may be introduced into the PECVD chamber at before and/or same time as the hydrocarbon compound and a plasma is initiated to begin deposition. The plasma-initiating gas may be a high ionization potential gas including, and not limited to, helium gas, hydrogen gas, nitrogen gas, argon gas and combinations thereof. The plasma-initiating gas may also be a chemically inert gas, such as helium gas, nitrogen gas, or argon gas. Suitable ionization potentials for gases are from about 5 eV (electron potential) to 25 eV. The plasma-initiating gas may be introduced into the PECVD chamber prior to the nitrogen containing hydrocarbon source and/or the hydrocarbon source, which allows a stable plasma to be formed and reduces the chances of arcing.

An inert gas is typically used as a dilution gas or a carrier gas to flow with the hydrocarbon source, the plasma-initiating gas, the nitrogen containing hydrocarbon source, or combinations thereof. Suitable dilution gases and parameters thereof can be the same as dilution gases described with reference to FIG. 2C. Conformality of amorphous carbon can be optimized by choice of precursors and deposition conditions. In general, precursors with lower H:C ratio (<1:1 ratio) yield higher conformality.

As discussed above, at suitable conditions, the energetic plasma, comprising some combination of carbon, nitrogen and hydrogen atoms, reacts with and binds to the surface of patterned photoresist layer 202 and to the surface of the conformal organic layer 218 to form a second conformal organic layer 220. The second conformal organic layer 220 grows uniformly over the surface of the photoresist layer 202 and the conformal organic layer 218, and is physically and chemically adhered to the surfaces thereof. By depositing a second conformal organic layer 220, the CD of the features is further reduced without changing the thickness of the photoresist layer 202.

The low temperature methods typically yield higher growth rates of second conformal organic layer 220 and lower intrinsic carbon layer stresses. By comparison, higher temperature deposits of carbon feature higher stresses due to increased cross-linking, shrinkage, and differences in density, which may lead to delamination of the second conformal organic layer 220 and distortion of the photoresist layer 202. Further unexpected advantages in some embodiments are realized by judicious choice of hydrocarbon and nitrogen precursors. For example, propylene and ammonia may produce carbon layers with enhanced adhesion to the photoresist, step coverage and other desirable carbon layer properties. In one example, propylene gas and ammonia gas are introduced into a processing chamber at a volumetric hydrocarbon source and nitrogen source volumetric ratio of between about 50:1 and about 5:1, and wherein the plasma is generated in the processing chamber is delivered at an RF power density between about 0.01 W/cm$^2$ and about 10 W/cm$^2$. Different chemistries may be chosen for better adherence to the conformal organic layer 218.

Figure 2F:
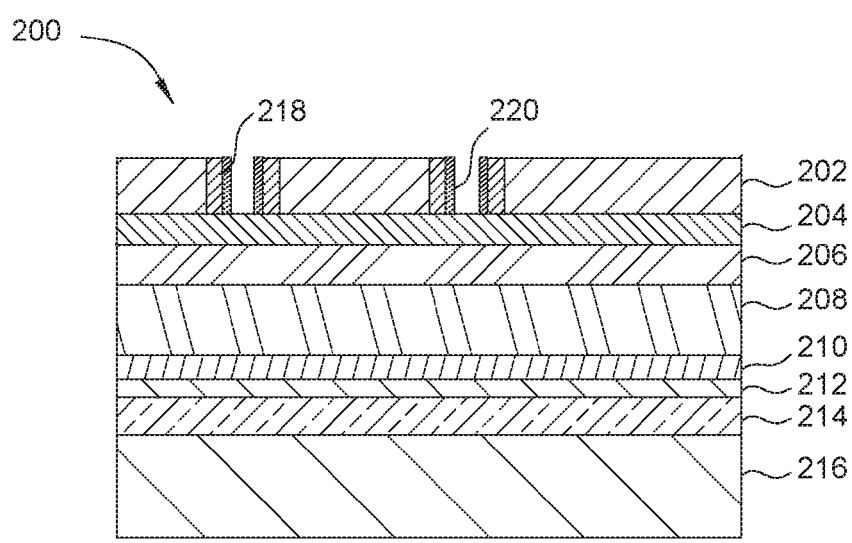

Next, the second conformal organic layer 220 is removed using an anisotropic etch process, as illustrated in FIG. 2F. Here the second conformal organic layer 220 is removed from the top field region and the bottom of the feature using a plasma etching process. In some embodiments, the selective etching process may be an anisotropic etching process designed to etch material from horizontal surfaces of the substrate only. Such processes may be substantially similar to the processes described with reference to removing the conformal organic layer 218 from the bottom as described with reference to FIGS. 2C and 2D. At the same time, such a process may also result in substantial removal of the second conformal organic layer 220 from the field region of the photoresist layer 202, also illustrated in FIG. 2D. Reactive ion etching using fluorine and oxygen ions is one example of a selective etching process useful for practicing embodiments of the disclosure. Other suitable etching methods, such as etching by non-reactive ions, may also be used.

Figure 2G:
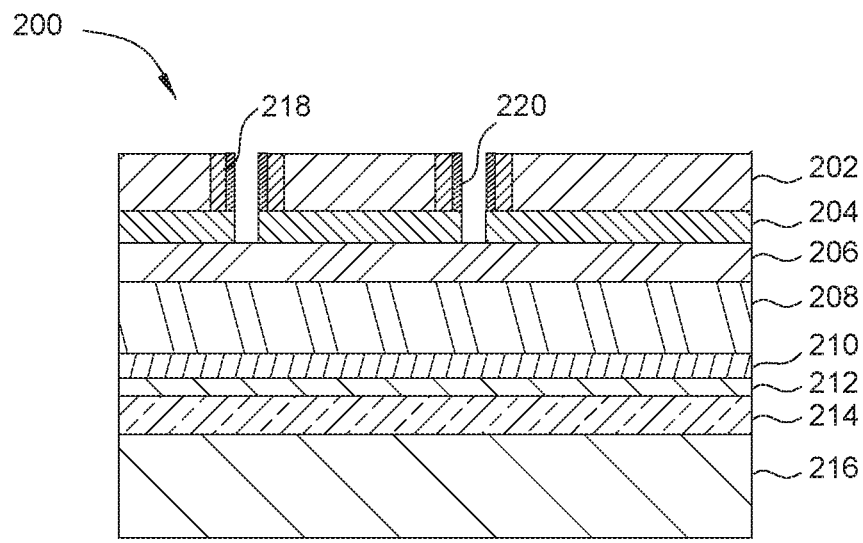

As illustrated in FIG. 2G, the conformal organic layer 218 and the second conformal organic layer 220 deposited on the sidewalls serves as an etching mask for creation of a reduced dimension feature in the hardmask layer 204, at 108. The thickness of the conformal organic layer 218 and the second conformal organic layer 220 on the sidewalls define the critical dimension of the pattern etched into hardmask layer 204. For example, if the recess or pattern originally formed in the photoresist is 40 nm wide, a conformal organic layer 218 which is 5 nm wide on opposite sidewalls and a second conformal organic layer 220 which is 5 nm wide on opposite sidewalls will reduce the width of the pattern etched in the hardmask layer 204 to 20 nm after a directional or anisotropic etch. If the second conformal organic layer 220 is formed from a material having high etch selectivity with respect to the etchant used to etch the hardmask layer 204, the second conformal organic layer 220 will only etch slowly or not at all, leaving a reduced critical dimension feature etched in the hardmask layer 204 as shown in FIG. 2E. Etching of the hardmask layer 204 may be performed by any method known to etch the material of which the hardmask layer 204 is formed. In one embodiment, the etch is performed by a process that will not significantly etch the conformal organic layer 218 or the second conformal organic layer 220. A directional etch, such as etching under bias using reactive or non-reactive ions, may be advantageous for preserving the sidewall remnants of the second conformal organic layer 220 while etching the reduced dimension pattern in the hardmask layer 204. The directional selective etching process may be a directional or anisotropic etching process designed to etch material from horizontal surfaces of the substrate only. Such processes may feature a plasma etchant with an electrical bias applied to the substrate to encourage ions in the plasma to accelerate toward the substrate surface. In such processes, the accelerated ions will generally travel deep into the pattern recess such that a vast majority of reactive species impact the bottom portion of the recess as shown in FIGS. 2F and 2G. Reactive ion etching using fluorine and oxygen ions is one example of a selective etching process useful for practicing embodiments of the disclosure. Other etching methods, such as etching by non-reactive ions, may also be used.

Figure 2H:
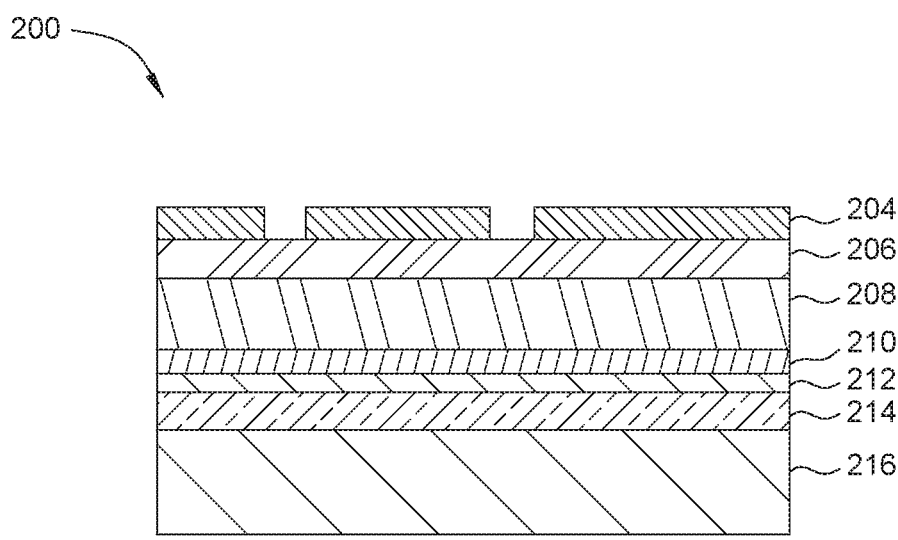

Multiple steps are performed to achieve the reduced dimension in the active layer 214 disposed over substrate 216 in FIG. 2H. Layer 214 may be described as the active layer comprised of reduced dimension lines and vias that are patterned in a dielectric material. As described herein, the method 100 may be useful in generating patterns having critical dimension smaller than the capability of a particular lithography apparatus or process.

Embodiments described herein relate to deposition of an ultra-conformal carbon-based material for decreasing the critical dimensions and line edge roughness of a feature formed in a photoresist or a hardmask. By depositing a conformal organic layer over formed features, prior to etching a component layer of a device, the size of the etched feature can be reduced, in some cases beyond the minimum etch size which is optically producible by the device. Further, the conformal organic layer will smooth out the roughness of the sidewall of the etched photoresist. Thus, the resulting feature will be both smaller and have reduced imperfections as compared to features formed by other methods.

While the foregoing is directed to embodiments of the methods and devices described herein, other and further embodiments may be devised without departing from the basic scope thereof, and the scope thereof is determined by the claims that follow.

The invention claimed is:

1. A method of processing a substrate, comprising:
   forming a feature in a photoresist layer to expose a portion of a hardmask layer deposited below the photoresist layer;
   depositing a first organic layer directly on the photoresist layer, the first organic layer conformally covering exposed surfaces of the feature and exposed portions of the hardmask layer;
   selectively removing the first organic layer from a top surface of the photoresist layer and the exposed portions of the hardmask layer, while leaving the first organic layer deposited on sidewalls of the feature substantially intact;
   forming a second organic layer conformally on the top surface of the photoresist layer, the exposed portion of the hardmask layer and the sidewalls of the feature;
   selectively removing the second organic layer from the top surface of the photoresist layer and the exposed portion of the hardmask layer, while leaving the second organic layer deposited on the first organic layer on the sidewalls of the feature substantially intact; and
   forming a pattern into the hardmask layer using the photoresist layer, the first organic layer and the second organic layer as a mask.

2. The method of claim 1, wherein the forming a pattern into the hardmask layer exposes a portion of an anti-reflective layer deposited below the hardmask layer.

3. The method of claim 1, further comprising:
   removing the first organic layer and the second organic layer and the photoresist layer.

4. The method of claim 1, wherein the thickness of the first organic layer and the thickness of the second organic layer on the sidewalls define a critical dimension of the pattern formed into the hardmask layer.

5. The method of claim 1, wherein the forming a pattern into the hardmask layer is performed by a directional etch or an anisotropic etch process with an electrical bias applied to the substrate.

6. The method of claim 5, wherein the directional etch or the anisotropic etch process uses fluorine and oxygen ions.

7. The method of claim 1, wherein the deposition of the first organic layer is maintained at a temperature of between about 25° C. and about 150° C.

8. A method of processing a substrate, comprising:
   forming a feature in a photoresist layer to expose a portion of a hardmask layer deposited below the photoresist layer;
   depositing a first organic layer directly on the photoresist layer by exposing the photoresist layer to a plasma formed from a hydrocarbon source, a plasma-initiating gas, and a dilution gas, the first organic layer conformally covering exposed surfaces of the feature and exposed portions of the hardmask layer;
   selectively removing the first organic layer from a top surface of the photoresist layer and the exposed portions of the hardmask layer, while leaving the first organic layer deposited on sidewalls of the feature substantially intact;
   forming a second organic layer conformally on the top surface of the photoresist layer, the exposed portion of the hardmask layer and the sidewalls of the feature;
   selectively removing the second organic layer from the top surface of the photoresist layer and the exposed portion of the hardmask layer, while leaving the second organic layer deposited on the first organic layer on the sidewalls of the feature substantially intact; and
   forming a pattern into the hardmask layer using the photoresist layer, the first organic layer and the second organic layer as a mask.

9. The method of claim 8, wherein the hydrocarbon source is a nitrogen-containing hydrocarbon source comprising methylamine, dimethylamine, trimethylamine (TMA), triethylamine, aniline, quinoline, pyridine, acrilonitrile, benzonitrile, or combinations thereof.

10. The method of claim 8, wherein the hydrocarbon source comprises a fluorine-containing gas, an oxygen-containing gas, a hydroxyl group-containing gas, and a boron-containing gas.

11. The method of claim 10, wherein the hydrocarbon source further comprises a nitrogen-containing gas.

12. The method of claim 11, wherein the hydrocarbon source comprises alkynes or alkenes.

13. The method of claim 12, wherein the hydrocarbon source comprises acetylene ($C_2H_2$) or propylene.

14. The method of claim 13, wherein the hydrocarbon source is propylene and the nitrogen-containing gas is ammonia.

15. The method of claim 14, wherein the hydrocarbon source is introduced into a processing chamber at a first volumetric flowrate and the nitrogen-containing gas is introduced into the processing chamber at a second volumetric flowrate, and a ratio of the first volumetric flowrate to the second volumetric flowrate is between about 50:1 and about 5:1.

16. The method of claim 8, wherein the deposition of the first organic layer is maintained at a temperature of between about 25° C. and about 150° C.

17. A method of processing a substrate, comprising:
    forming a feature in a photoresist layer to expose a portion of a hardmask layer deposited below the photoresist layer;
    depositing a first organic layer directly on the photoresist layer, wherein the first organic layer is an amorphous carbon layer conformally covering exposed surfaces of the feature and exposed portions of the hardmask layer;
    selectively removing the first organic layer from a top surface of the photoresist layer and the exposed portions of the hardmask layer, while leaving the first organic layer deposited on sidewalls of the feature substantially intact;
    forming a second organic layer conformally on the top surface of the photoresist layer, wherein the second organic layer is an amorphous carbon layer;
    selectively removing the second organic layer from the top surface of the photoresist layer and the exposed portion of the hardmask layer, while leaving the second organic layer deposited on the first organic layer on the sidewalls of the feature substantially intact; and
    forming a pattern into the hardmask layer using the photoresist layer, the first organic layer and the second organic layer as a mask.

18. The method of claim 17, wherein the deposition of the first organic layer is maintained at a temperature of between about 25° C. and about 150° C.

19. The method of claim 17, wherein the depositing a first organic layer directly on the photoresist layer is performed by exposing the photoresist layer to a plasma formed from a nitrogen-containing hydrocarbon source, a plasma-initiating gas, and a dilution gas.

20. The method of claim 19, wherein the nitrogen-containing hydrocarbon source comprises methylamine, dimethylamine, trimethylamine (TMA), triethylamine, aniline, quinoline, pyridine, acrilonitrile, benzonitrile, or combinations thereof.

* * * * *

UNITED STATES PATENT AND TRADEMARK OFFICE
CERTIFICATE OF CORRECTION

PATENT NO. : 10,014,174 B2  
APPLICATION NO. : 15/602862  
DATED : July 3, 2018  
INVENTOR(S) : Bencherki Mebarki et al.

Page 1 of 1

It is certified that error appears in the above-identified patent and that said Letters Patent is hereby corrected as shown below:

On sheet 1 of 5, in Figure 1, reference numeral 112, Line 2, delete "PATTTERNED" and insert -- PATTERNED --, therefor.

In Column 4, Line 59, delete "diazonapthoquinone" and insert -- diazonaphthoquinone --, therefor.

In Column 7, Line 11, delete "imidiazole," and insert -- imidazole, --, therefor.

In Column 7, Line 12, delete "acrilonitrile," and insert -- acrylonitrile, --, therefor.

In Column 7, Line 16, delete "metanol," and insert -- methanol, --, therefor.

In Column 14, Line 53, in Claim 9, delete "acrilonitrile," and insert -- acrylonitrile, --, therefor.

In Column 16, Line 22, in Claim 20, delete "acrilonitrile," and insert -- acrylonitrile, --, therefor.

Signed and Sealed this  
Twenty-eighth Day of August, 2018

Andrei Iancu  
*Director of the United States Patent and Trademark Office*